(12) United States Patent
Lee et al.

(10) Patent No.: US 12,206,368 B2
(45) Date of Patent: Jan. 21, 2025

(54) HIGH-GAIN AMPLIFIER BASED ON DUAL-GAIN BOOSTING

(71) Applicant: KOREA ADVANCED INSTITUTE OF SCIENCE AND TECHNOLOGY, Daejeon (KR)

(72) Inventors: Sang Gug Lee, Daejeon (KR); Dae Woong Park, Daejeon (KR); Dzuhri Radityo Utomo, Daejeon (KR); Byeong Hun Yun, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 602 days.

(21) Appl. No.: 17/336,832

(22) Filed: Jun. 2, 2021

(65) Prior Publication Data
US 2022/0393651 A1 Dec. 8, 2022

(51) Int. Cl.
*H03F 3/191* (2006.01)
*H03F 1/56* (2006.01)
*H03F 3/04* (2006.01)

(52) U.S. Cl.
CPC ............... *H03F 3/04* (2013.01); *H03F 1/56* (2013.01); *H03F 2200/222* (2013.01); *H03F 2200/387* (2013.01)

(58) Field of Classification Search
CPC .................................. H03F 3/191; H03F 1/22
USPC ..................................... 330/302, 310
See application file for complete search history.

(56) References Cited

U.S. PATENT DOCUMENTS

| | | | |
|---|---|---|---|
| 7,315,205 B2 * | 1/2008 | Kim | H03F 1/0277 330/51 |
| 7,567,128 B2 * | 7/2009 | Oka | H03F 1/56 330/306 |
| 7,602,240 B2 * | 10/2009 | Gao | H03H 7/38 330/98 |
| 8,354,888 B2 * | 1/2013 | Matsuzuka | H03F 3/60 330/296 |
| 2009/0189695 A1 | 7/2009 | Lai et al. | |

OTHER PUBLICATIONS

Korean Office Action corresponding to 10-2019-0026277 mailed Feb. 29, 2024.

\* cited by examiner

*Primary Examiner* — Henry Choe
(74) *Attorney, Agent, or Firm* — Finch & Maloney PLLC

(57) ABSTRACT

Provided is a high-gain amplifier based on double-gain boosting including a first gain amplification unit including a first amplifier, a second amplifier, and a an interstage matching network connected between the first amplifier and the second amplifier and performing primary amplification; and a second gain amplification unit connected in parallel with the first gain amplification unit and performing secondary boosting.

3 Claims, 12 Drawing Sheets

(a)

(b)

(a)

(b)

(a)

(b)

(c)

(a)

(b)

(a)

(b)

(c)

HIGH-GAIN AMPLIFIER BASED ON DUAL-GAIN BOOSTING

BACKGROUND

1. Field

The present invention relates to a high-gain amplifier capable of primarily performing gain boosting through an amplifier and secondarily performing gain boosting once again.

2. Description of Related Art

Today, with the development of systems for transmitting and receiving high-speed wireless data such as mobile phones, DMB phones, PDAs, and UWBs, high-gain and broadband CMOS amplifiers are required for application to such systems.

Recently, most research has been focused on the development of a transceiver or each component block driven in a band of 0.2 terahertz to 0.3 terahertz band, including an amplifier which is the most basic component of a transceiver. For spectroscopy and ultra-high speed communications, a broadband amplifier is an essential component because most of the terahertz amplifiers driven above the reported 0.2 terahertz wave have a very narrow band. In order to be driven in a wideband, commonly used techniques such as stagger tuning and distribution are required. The stagger tuning and distributed amplifiers have a disadvantage in that the bandwidth may be improved, but gains obtained by each step are insufficient. Accordingly, in order to obtain a high gain, a vast number of steps are required. To this end, a size of a chip becomes very large, and power consumption may increase.

As an operating frequency approaches fmax, it is difficult to design a high-gain amplifier by introducing a low intrinsic gain (U, Gma, and Gms) of a transistor. Therefore, many amplifiers introducing a maximum achievable gain Gmax of a transistor have been reported. However, even if Gmax is introduced, a gain per stage of the actual amplifier is much less than the Gmax due to passive components (embedding network, input/output/interstage matching) that have large losses at high operating frequencies. In order to compensate for the insufficient gain due to this loss, the number of stages of the amplifier increases, which shows a limitation in that a larger DC power is required.

SUMMARY

The present invention provides a high-gain amplifier capable of obtaining a high gain by primarily performing gain boosting and secondly performing gain boosting once again.

Other objects and advantages of the present disclosure may be understood by the following description and will be more clearly appreciated by exemplary embodiments of the present disclosure. In addition, it may be easily appreciated that objects and advantages of the present disclosure may be realized by means mentioned in the claims and a combination thereof.

According to an aspect of the present disclosure, a high-gain amplifier based on double-gain boosting includes a first gain amplification unit including a first amplifier, a second amplifier, and a first matching unit connected between the first amplifier and the second amplifier and performing primary amplification; and a second gain amplification unit connected in parallel with the first gain amplification unit and performing secondary boosting.

The first amplifier and the second amplifier may include: a first transmission line; a transistor connected to a rear end of the first transmission line; a second transmission line connected to a rear end of the transistor; and a third transmission line connected to a front end of the first transmission line and a rear end of the second transmission line and connected in parallel with the first transmission line, the transistor, and the second transmission line.

The second gain amplification unit may include: a fourth transmission line connected between a front end of the first amplifier and an input terminal; a fifth transmission line connected between a rear end of the second amplifier and an output terminal; and a sixth transmission line connected between a front end of the fourth transmission line and a rear end of the fifth transmission line.

The high-gain amplifier may further include: a second matching unit connected to a rear end of the second amplifier; and a third amplifier connected between a rear end of the second matching unit and the second gain amplification unit.

DETAILED DESCRIPTION

Hereinafter, detailed contents for embodying the present invention will be described in detail with reference to the accompanying drawings.

Figure 1:
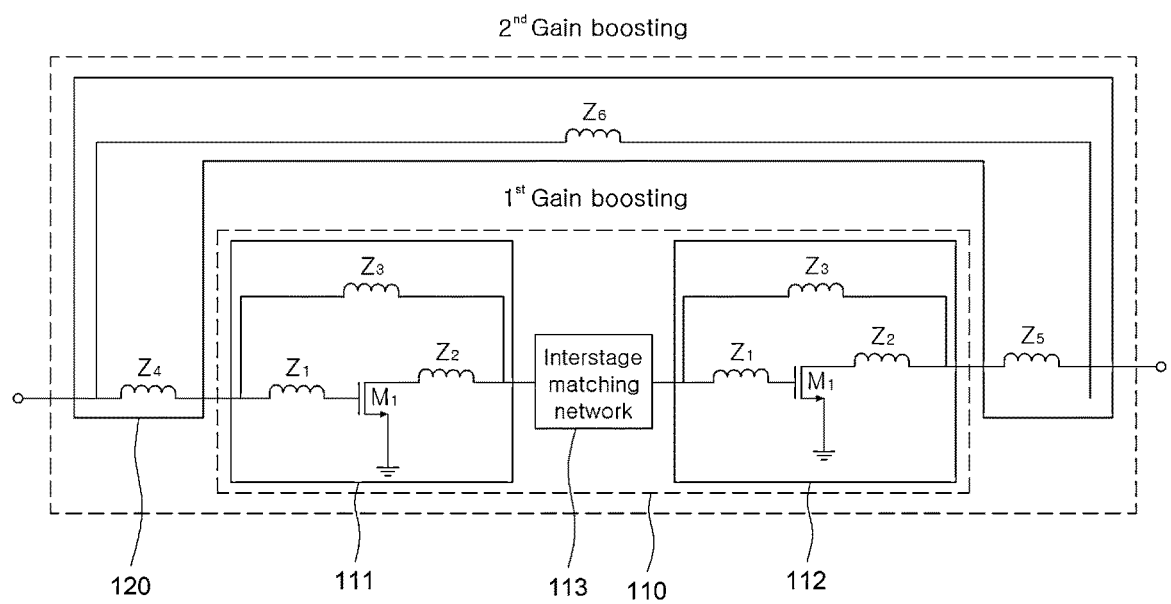
FIG. 1 is a diagram illustrating a high-gain amplifier based on double-gain boosting according to an embodiment of the present invention.

FIG. 1 is a diagram illustrating a high-gain amplifier based on double-gain boosting according to an embodiment of the present invention.

Referring to FIG. 1, a high-gain amplification unit 100 based on double-gain boosting includes a first gain amplification unit 110 and a second gain amplification unit 120.

The first gain amplification unit 110 includes a first amplifier 111, a second amplifier 112, and an interstage matching network 113.

Each of the first and second amplifiers 111 and 112 includes a first transmission line Z1, a transistor M1, a second transmission line Z2, and a third transmission line Z3.

The first transmission line Z1 is connected to an input terminal, and may have a first reactance value capable of obtaining a maximum achievable gain at a set first frequency and a second reactance value capable of obtaining a maximum achievable gain at a second frequency.

The transistor 120 may be connected to a rear end of the first transmission line Z1.

The second transmission line Z2 is connected to a rear end and an output terminal of the transistor, and may have a third reactance value capable of obtaining a maximum achievable gain at a set first frequency and a fourth reactance value capable of obtaining a maximum achievable gain at a second frequency.

The third transmission line Z3 may be connected between the input terminal and the output terminal.

The third transmission line Z3 may be connected in parallel with the first transmission line Z1, the transistor 120, and the second transmission line Z2.

The third transmission line 140 is connected to an input terminal, and may have a fifth reactance value capable of obtaining a maximum achievable gain at set first frequency and a sixth reactance value capable of obtaining a maximum achievable gain at a second frequency.

The interstage matching network 113 may be connected between the first amplifier 111 and the second amplifier 112, and match both amplifiers.

The second gain amplification unit 120 is connected in parallel with the first gain amplification unit 110 and may perform secondary amplification.

The second gain amplification unit 120 may include a fourth transmission line Z4 connected between a front end of the first amplifier 111 and an input terminal, a fifth transmission line Z5 connected between a rear end of the second amplifier 112 and an output terminal, and a sixth transmission line Z6 connected between a front end Z4 of the fourth transmission line Z4 and a rear end Z5 of the fifth transmission line.

In addition, the high-gain amplifier 100 based on double-gain boosting may further include a second matching unit (not illustrated) connected to the rear end of the second amplifier 112, and a third amplifier (not illustrated) connected between the rear end of the second matching unit (not illustrated) and the second gain amplification unit. In this way, in the high-gain amplifier 100 based on double-gain boosting, N amplifiers and matching units may be arranged in cascade, and N may be variously selected according to circumstance.

Figure 2:
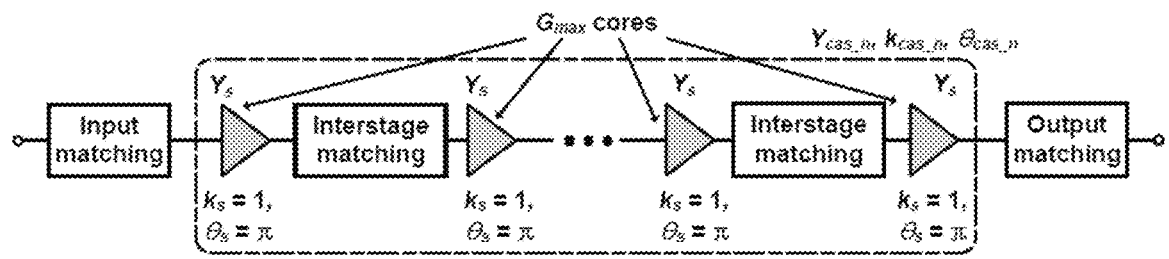
FIG. 2 is a schematic of n-stage cascaded Gmax cores with matching networks.

FIG. 2 is a schematic of n-stage cascaded Gmax cores with matching networks.

Referring to FIG. 2, FIG. 2 shows the schematic of n-stage cascaded Gmax cores with matching networks, where all the transistors are identical and embedded into a linear, lossless, reciprocal (LLR) networks to achieve Gmax at the target frequency, that is, the transfer parameter ratio (As) of each Gmax core is given by [18], [21], [31]

$$A_s = \frac{Y_{21s}}{Y_{12s}} = -G_{max\_tr}, \quad (1)$$

$$\theta_s = \text{phase}(A_z) = \pi \quad (2)$$

$$k_s = 1. \quad (3)$$

In FIG. 2, Ys, Ycas_n, ks, kcas_n, $\theta$s, and $\theta$cas n represent Y-parameter, Rollet stability factor, and the phase of A for the Gmax core and the n-stage cascaded Gmax cores, respectively, and Gmax_tr represents the Gmax value of a transistor. Assuming that all passive components for the embedding and interstage matching networks are linear, lossless and reciprocal, Acas_n, $\theta$cas_n, and kcas_n of the n-stage Gmax cores are given by $$A_{ces\_n} = \frac{Y_{21cas\_n}}{Y_{12cas\_n}} = \left(\frac{Y_{21s}}{Y_{12s}}\right)^n = (-G_{max\_tr})^n = (-1)^n \times G^n_{max\_tr} \quad (4)$$

$$\theta_{cas\_n} = \theta_s \times n = \pi \times n \quad (5)$$

$$k_{cas\_n} = 1. \quad (6)$$

respectively. By substituting Acas_n, kcas_n, and $\theta$cas_n into Gma and U equation [21], the maximum available gain (Gma_cas_n) and unilateral gain (Ucas_n) of the n-stage cascaded Gmax cores can be given by $$G_{ma\_cas\_n} = \left|\frac{Y_{21s}}{Y_{12s}}\right|^n \left(k_s - \sqrt{k_z^2 - 1}\right)^n = |-G_{max\_tr}|^n = G^n_{max\_tr}, \quad (7)$$

$$U_{cas\_n} = \frac{|A_{cas\_n} - 1|^2}{2k_{cas\_n}|A_{cas\_n}| - 2\text{Re}(A_{cas\_n})} = \frac{A^2_{cas\_n} - 2A_{cas_n} + 1}{2k_{cas\_n}|A_{cas\_n}| - 2|A_{cas\_n}|\cos(\theta_{cas\_n})} \quad (8)$$

which leads to the maximum achievable gain (Gmax_cas_n) of the n-stage cascaded Gmax cores given by $$G_{max\_cas\_n} = (2U_{cas_n} - 1) + 2\sqrt{U_{cas\_n}(U_{cas\_n} - 1)}. \quad (9)$$

Note that, as can be seen in (7), the overall gain of n-stage cascaded Gmax cores, Gma_cas_n, is limited to Gmax trn. To achieve Ucas_n and Gmax_cas_n, additional embedding networks have to be applied to the n-stage cascaded Gmax cores. As follows, the characteristics of Ucas_n and Gmax_cas_n show uniquely different behavior depends on whether the numbers of stages are odd or even.

In the case of odd number of cascaded Gmax cores, Ucas_n is given by $$U_{cas\_n} = \frac{|-G^n_{max\_tr} - 1|^2}{2k_{cas\_n}|-G^n_{max\_tr}| - 2\text{Re}(-G^n_{max\_tr})} = \frac{G^{2n}_{max\_tr} + 2G^n_{max\_tr} + 1}{4G^n_{max\_tr}}. \quad (10)$$

By substituting (10) into (9), Gmax_cas_n is given by $$G_{max\_cas\_n} = G_{max\_tr}^n. \quad (11)$$

From (11), maximum achievable gain which is applied to an odd number of cascaded Gmax cores (Gmax_cas_n) is the same as the maximum available gain of the cascaded Gmax cores (Gmax_trn) as in (7). This means that the gain higher than Gmax trn cannot be achieved even with additional embedding network for Gmax, that is, double-Gmax.

However, in the case of even number of cascaded Gmax cores, Ucas_n is given by $$U_{cas\_n} = \frac{|G^n_{max\_tr} - 1|^2}{2k_{cas\_n}|G^n_{max\_tr}| - 2\text{Re}(G^n_{max\_tr})} = \frac{G^{2n}_{max\_tr} - 2G^n_{max\_tr} + 1}{2 \times 1 \times G^n_{max\_tr} - 2G^n_{max\_tr}} = \infty. \quad (12)$$

which leads to $$G_{max\_cas\_n} = \infty. \tag{13}$$

As can be seen in (12) and (13), in principle, the unilateral (Ucas_n) and maximum achievable (Gmax_cas_n) gains, implemented with an even number of cascaded Gmax cores can approach infinity. Note that, (12) and (13) are valid at fo<fmax since the Gmax of the single transistor is defined at fo<fmax.

Even though both Ucas_n and Gmax_cas_n in (12) and (13) can approach infinity at the target frequencies, Gmax_cas_n is more realistic to be adopted for the amplifier design since achieving zero reverse gain for Ucas_n at high operating frequencies is not practical mainly due to the substrate coupling. The implementation of Gmax_cas_n is much easier and straightforward. It is to be noted, however, that (12) and (13) represents, by definition, the boundary condition for oscillation. However, the oscillation can be easily avoided by adjusting $\theta$cas_n while satisfying the unconditional stability. Therefore, by adopting the double-Gmax core, the amplifier can achieve much higher gain per stage than Gmax_tr with unconditional stability.

FIG. 3a, FIG. 3b, FIG. 3c and FIG. 3d are design procedure of two-stage double-Gmax core. Transistor, single-transistor Gmax core, cascade of two single-transistor Gmax cores, and double-Gmax core.

Referring to FIG. 3a, FIG. 3b, FIG. 3c and FIG. 3d, any even number of cascaded Gmax cores can satisfy (12) and (13), but a cascade of two single-transistor Gmax cores is chosen for the implementation of high gain amplifier as it requires minimum chip area and dc power consumption.

Figure 3A:
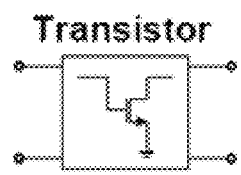
FIG. 3a, FIG. 3b, FIG. 3c and FIG. 3d are design procedure of two-stage double-Gmax core.
Figure 3B:
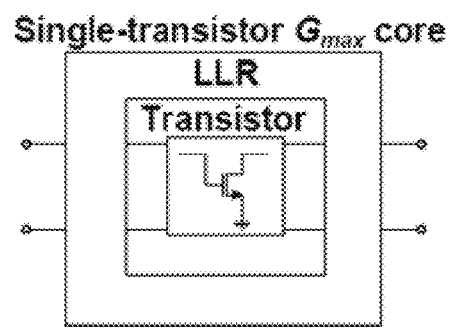

A step-by-step procedure which leads to double-Gmax core where all the passive components are assumed linear, lossless and reciprocal. In FIG. 3a, the characteristic of the transistor is represented by $A_{tr}$, $k_{tr}$, $\theta_{tr}$, $G_{ma\_tr}/G_{ms\_tr}$ and $G_{max\_tr}$. The transistor are satisfied the condition $G_{ma\_tr}/G_{ms\_tr} \leqslant G_{max\_tr}$ $G_{max}$ is equal to $G_{max\_tr}$ $A_{tr}$ $k_{tr}, \theta_{tr}$ $G_{ma\_tr}/G_{ms\_tr} \leqslant G_{max\_tr}$ $G_{max} = G_{max\_tr}$ The single-transistor Gmax core can be realized by embedding the transistor into an LLR network, as shown in FIG. 3b, that satisfies the condition $A_s = -G_{max\_tr}$, $k_s=1$, $\theta_s=\pi$, such that $G_{ma\_s}=G_{max\_tr}$. Due to the linear, lossless, and reciprocal nature of the embedding network, the Mason's Invariant Us of the single-transistor $G_{max}$ core is the same as that of the transistor, $U_{tr}$. Hence, the $G_{max}$ of the single-transistor $G_{max}$ core is the same as $G_{max\_tr}$ since $G_{max\_tr}$ is only a function of $U_{tr}$ as in (9).

Figure 3C:
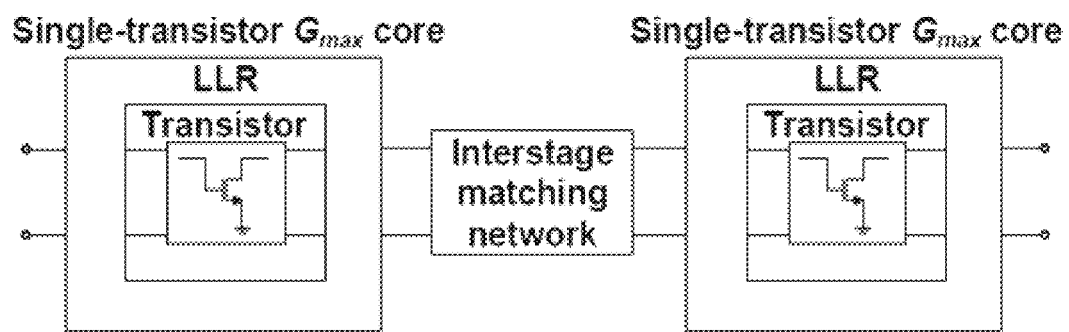

$A_s = -G_{max\_tr}$ $k_s=1, \theta_s=\pi$ $G_{ma\_s}=G_{max\_tr}$ $G_{max}=G_{max\_s}=G_{max\_tr}$ For a cascade of two single-transistor Gmax cores with interstage matching network, shown in FIG. 3c, $A_{\_cas\_2}$ is equal to $G_{max\_tr}^2$, $G_{ma\_cas\_2}$ is equal to $G_{max\_tr}^2$, $k_{cas\_2}=1$, $\theta_{cas\_2}=2\pi$ and $G_{max}$, i.e., $G_{max\_cas\_2}$ approaches 1 following (12) and (13), $G_{max}$ is equal to $G_{max\_cas\_2}$, $G_{max}$ approaches infinity.

Figure 3D:
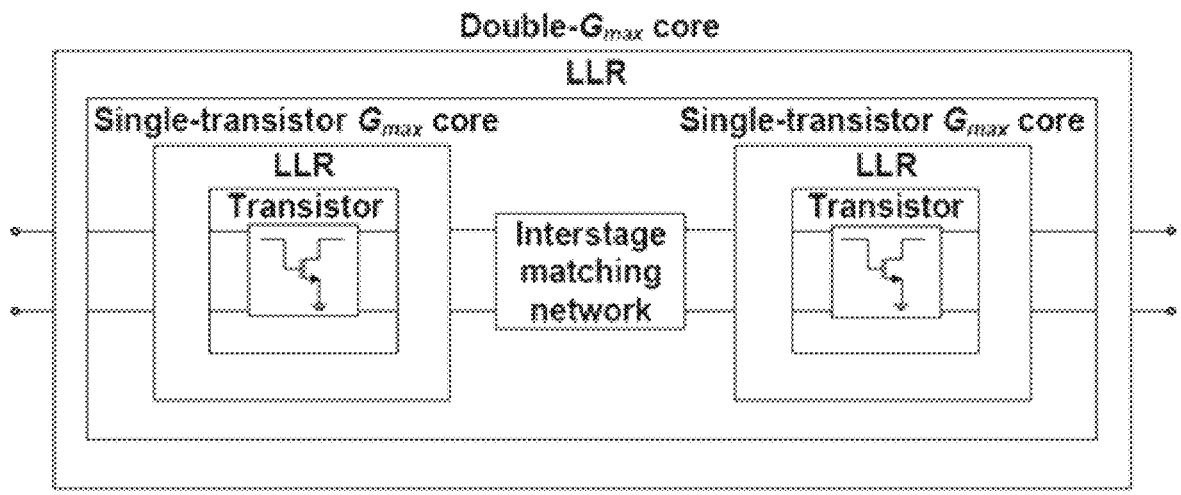

$A_{cas\_2}=G_{max\_tr}^2$ $k_{cas\_2}=1, \theta_{cas\_2}=2\pi$ $G_{ma\_cas\_2}=G_{max\_tr}^2$ $G_{max}=G_{max\_cas\_2}=\infty$ FIG. 3d shows the schematic of the double-$G_{max}$ core where an additional LLR is adopted onto the cascade of two single-transistor $G_{max}$ cores and satisfies the condition of $A_d = -G_{max\_cas\_2}$, $k_d=1$, $\theta d=\pi$, i.e., the values of $k_d$ and $\theta_d$ of double-$G_{max}$ core are 1 and, respectively, such that the gain ($G_{ma\_d}$) approaches infinity.

Figure 4:
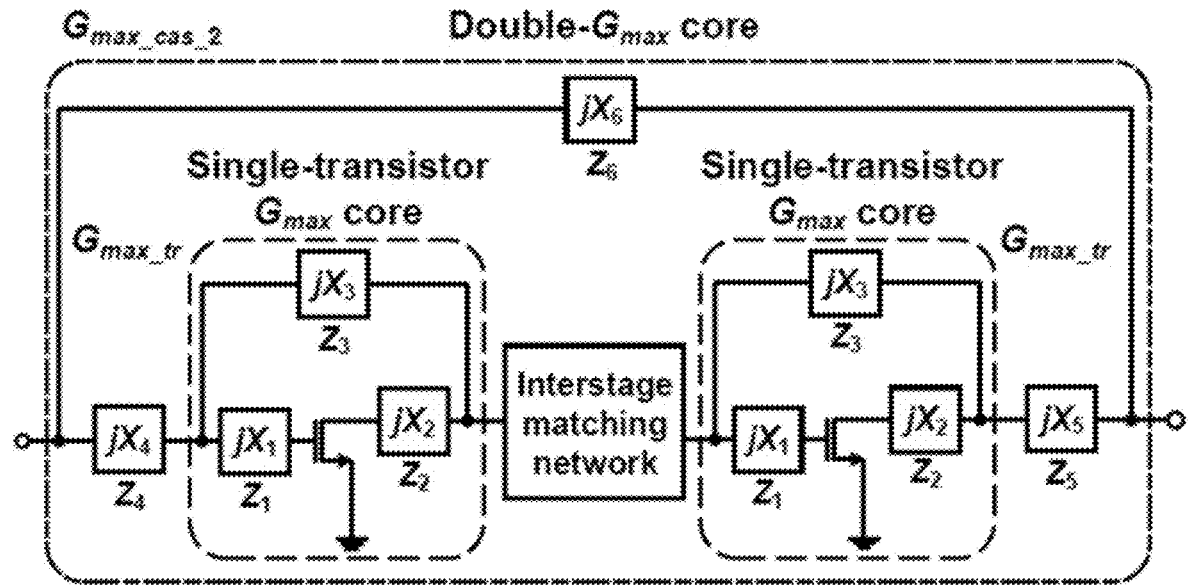
FIG. 4 is final general structure of the proposed two-stage double-Gmax core.

$A_d = -G_{max\_cas\_2}$ $k_d=1, \theta_d=\pi$ $G_{ma\_d}=G_{max\_cas\_2}=\infty$ FIG. 4 is final general structure of the proposed two-stage double-Gmax core.

Referring to FIG. 4, the final general structure of the proposed two-stage double-$G_{max}$ core. The reactive components $Z_1$, $Z_2$ and $Z_3$ are for the single-transistor $G_{max}$ core, and $Z_4$, $Z_5$ and $Z_6$ are for the implementation of $G_{max}$ onto the cascade of two single-transistor $G_{max}$ cores.

The gain of double-$G_{max}$ core can be controlled by varying the values of $k_s$ and $\theta_s$. This section describes the behaviors of double-$G_{max}$ core as a function of $k_s$ and $\theta_s$.

For the cascade of two single-transistor $G_{max}$ cores shown in FIG. 3c, the $k_{cas\_2}$ and $\theta_{cas\_2}$ can be given by $$k_{cas\_2}=2k_2^2-1, \tag{14}$$

and $$\theta_{cas\_2}=2\theta_2 \tag{15}$$

which become equal to 1 and $2\pi$, respectively, when $k_s=1$ and $\theta_s=\pi$. The derivation details of (14) is shown in Appendix A. Then, from (4) and the expression for $G_{ma}$ in [21], $A_{cas\_2}$ can be given by $$A_{ces\_n} = \frac{Y_{21cas\_n}}{Y_{12cas\_n}} = \left(\frac{Y_{21s}}{Y_{12s}}\right)^n = \left(\frac{G_{max\_tr}}{k_s - \sqrt{k_s^2-1}}\right)^2. \tag{16}$$

Substituting (14), (15) and (16) into the expression for the unilateral gain [21], the unilateral gain for the cascade of two single-transistor $G_{max}$ cores can be given by $$U_{cas\_z} = \frac{|A_{cas\_2}-1|^2}{2k_{cas\_2}|A_{cas\_2}|-2\text{Re}(A_{cas\_2})} \tag{17}$$

$$= \frac{\left(\frac{G_{ma_s}}{k_s-\sqrt{k_s^2-1}}\right)^4 - 2\left(\frac{G_{ma_s}}{k_s-\sqrt{k_s^2-1}}\right)^2 + 1}{(4k_z^2-2)\left(\frac{G_{ma_s}}{k_z-\sqrt{k_z^2-1}}\right)^2 - 2\left(\frac{G_{ma_s}}{k_s-\sqrt{k_s^2-1}}\right)^2 \cos(2\theta_s)}$$

and the maximum achievable gain of the cascade of two single transistor $G_{max}$ cores is given by $$G_{max\_cas\_2}=(2U_{cas\_2}-1)+2\sqrt{U_{cas\_2}(U_{cas\_2}-1)}. \tag{18}$$

Figure 5:
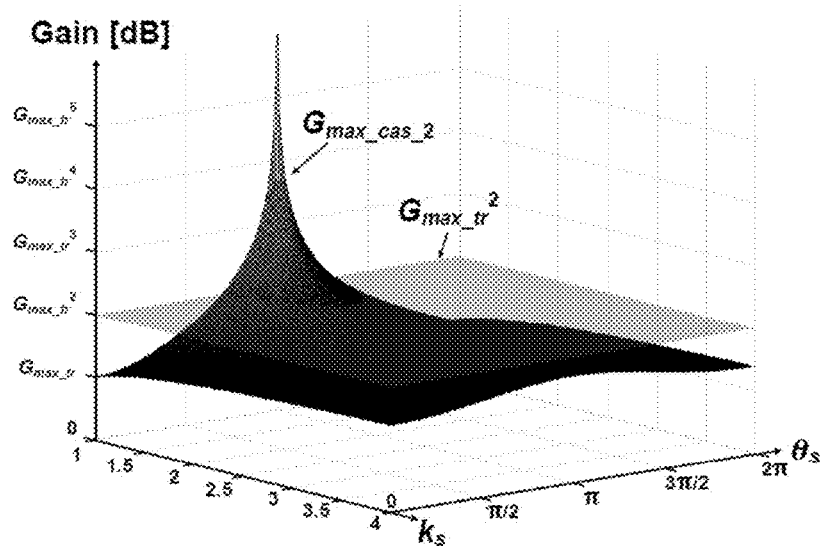
FIG. 5 is behavior of Gmax cas 2 as a function of ks and _s, from (17) and (18), in comparison with Gmax_tr2.

FIG. 5 is behavior of Gmax cas 2 as a function of ks and _s, from (17) and (18), in comparison with Gmax_tr2.

Referring to FIG. 5, the behavior of $G_{max\_cas\_2}$ as a function of $k_s$ and $\theta_s$, from (17) and (18), in comparison with $G_{max\_tr}^2$. Only $k_s>1$ region is shown considering unconditional stability. The plane parallel to $k_s$ and $\theta_s$-axis (in pink) represents the theoretical maximum available gain $(G_{max\_tr}^2)$ that can be obtained from a cascade of two single-transistor $G_{max}$ cores. As can be seen in FIG. 5,
1) $G_{max\_cas\_2}$ approaches infinity when $k_s=1$ and $\theta_s=\pi$,
2) $G_{max\_cas\_2}$ can have much higher values of gain than $G_{max\_tr}^2$ as $k_s$ and $\theta_s$ approach 1 and $\pi$, respectively.
3) Contrary to the common perception, it is possible to obtain a gain higher than $G_{max\_tr}$ per transistor stage while satisfying the unconditional stability.

Based on the analysis described in Section III, this section presents a practical implementation example of a 250 GHz two-stage double-$G_{max}$ core. An n-MOSFET having a channel length of 60 nm and a total width of 12 um with 20 fingers, same as the one in [21], is adopted for the design, which is biased at $V_{GS}=V_{DS}=1$ V with $I_{DS}=10.75$ mA. The simulated $f_{max}$ of the given transistor with optimized layout is 395 GHz, where the interconnect metals and contacts up to the top signal metal line are included in the transistor layout, and $G_{max\_tr}$ at 250 GHz is 9.95 dB.

Figure 6A:
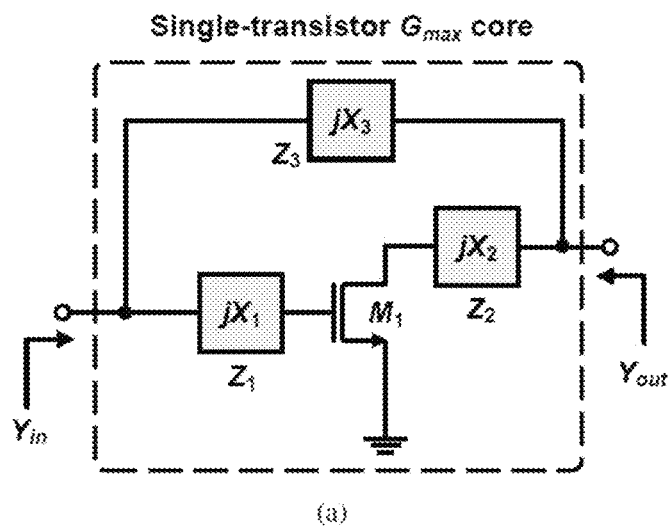
FIG. 6a and FIG. 6b is design of a single-transistor Gmax core with three passive elements.
Figure 6B:
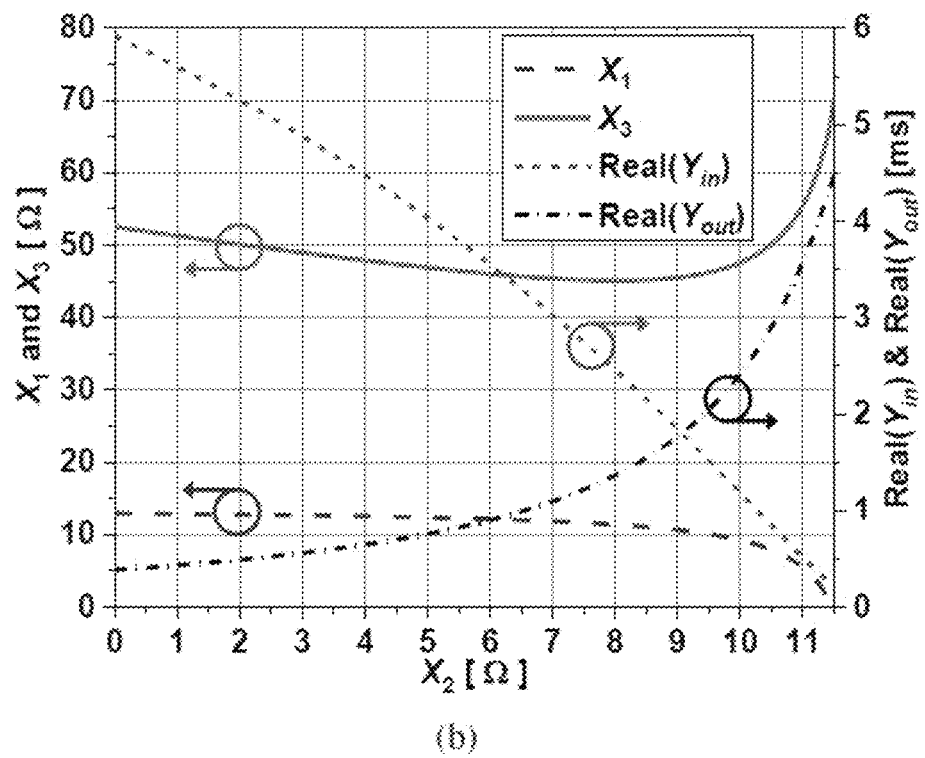

FIG. 6a and FIG. 6b is design of a single-transistor Gmax core with three passive elements.

Referring to FIG. 6a and FIG. 6b, to design a cascade of two single-transistor $G_{max}$ cores, a single-transistor $G_{max}$ core should be designed in advance, which is shown in FIG. 6a and FIG. 6b, where a three passive elements based embedding network is chosen as it allows infinite combinations of embedding network for gain-boosting [18], [21], [22]. In FIG. 5(a), $Y_{in}$ and $Y_{out}$ represent input and output admittances of the $G_{max}$ core, respectively. The single-transistor $G_{max}$ core is designed in terms of minimizing the chip area and passive component loss as in [18] except that the $\theta_s$ value has been shifted to 195° which makes the gain $(G_{max\_cas\_2})$ to be less susceptible to the PVT variations by reducing the gain, considering the sharp increase in $G_{max\_cas\_2}$ at the values of $k_s$ and $\theta_s$'s near 1 and $\pi$ as shown in FIG. 5. The target power gain of the double-$G_{max}$ core is set to be around 10 dB higher than that of the cascade of two single-transistor $G_{max}$ cores. The $k_s$ of implemented single-transistor $G_{max}$ core will increase slightly higher than 1 due to the passive component losses even though the design point of $k_s$ is set to 1. Under this condition, $G_{max\_cas\_2}$ shows around 10 dB higher gain than that of the cascade of two single-transistor $G_{max}$ cores $(G_{max\_tr}^2)$ when $\theta_s=195°$. Therefore, $k_s=1$ and $\theta_s=195°$ are chosen as a design point considering both target power gain and abrupt PVT variation. FIG. 5 (b) shows the values of $X_3$, $X_1$, Real $(Y_{in})$ and Real $(Y_{out})$ as a function of $X_2$ that satisfies $k_s=1$ and $\theta_s=195°$ conditions at 250 GHz. As shown in FIG. 6b, the input (Real $(Y_{in})$) and output (Real $(Y_{out})$) conductances of the single-transistor $G_{max}$ core vary over the $X_1$, $X_2$ and $X_3$ combinations. Utilizing this property, the loss and chip area of the interstage matching network can be minimized [18] as follows.

Figure 7A:
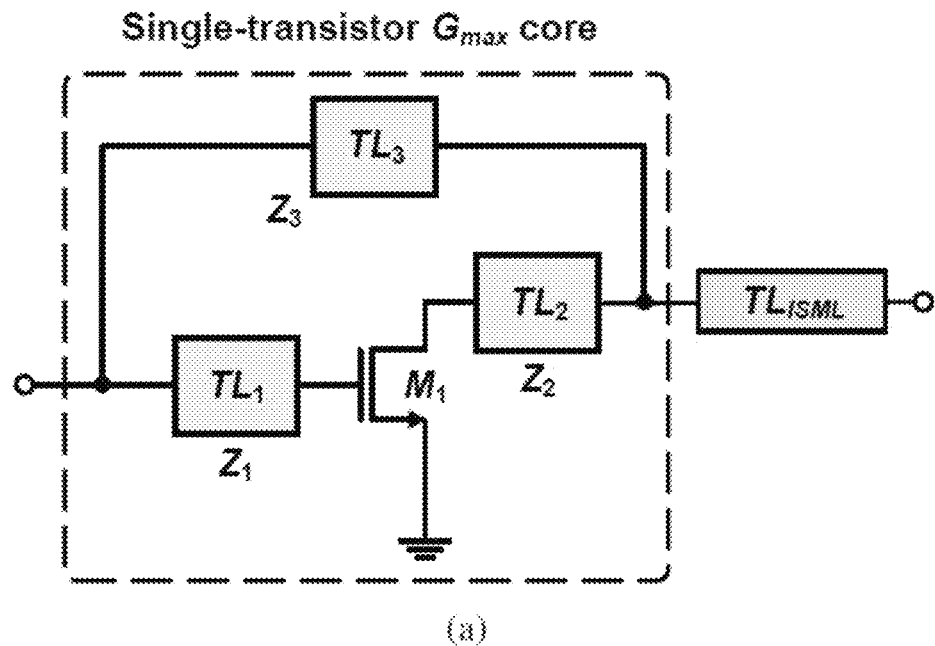
FIG. 7a and FIG. 7b is design of single-transistor Gmax core considering the size of series connected transmission line TLISML for the interstage matching.
Figure 7B:
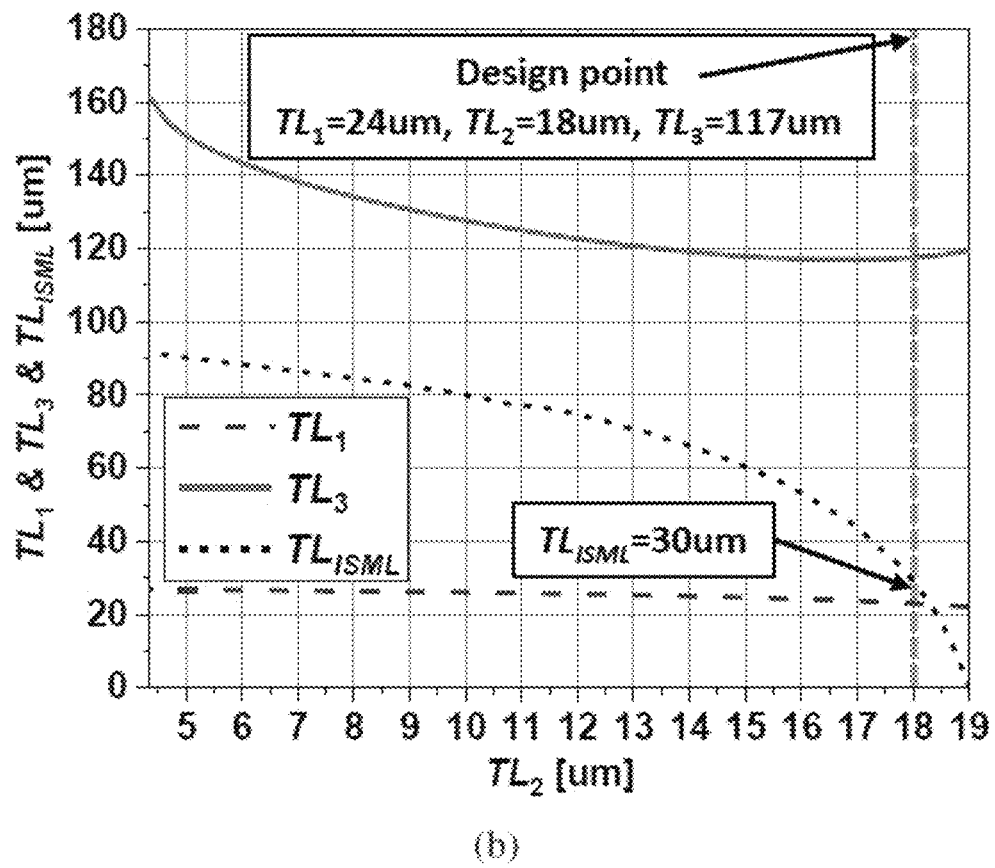

FIG. 7a and FIG. 7b is design of single-transistor Gmax core considering the size of series connected transmission line TLISML for the interstage matching.

Referring to FIG. 7a and FIG. 7b, FIG. 6 shows the details of how the values of LLR embedding network for the single-transistor $G_{max}$ core are determined considering the size of series connected transmission line $TL_{ISML}$ for the interstage matching. As shown in FIG. 7a, transmission lines (TLs) with characteristic impedance $(Z_o)$ of 50 are used for $Z_1$, $Z_2$ and $Z_3$ and the wavelength $(\lambda)$ of the TLs at 250 GHz is assumed 653 um. FIG. 7b shows the physical length of the $TL_1$, $TL_3$ and $TL_{ISML}$ as a function of the length of $TL_2$ that satisfies the $G_{max}$ condition. Generally, a shorter interstage series matching element is advantageous in terms of the insertion loss [32]. Even though the interstage matching for the real part between the two $G_{max}$ cores can be achieved by adjusting the value of embedding network without $TL_{ISML}$, the adoption of $TL_{ISML}$, 30 um as a minimum, not only minimizes the insertion loss of interstage matching network but also helps prevent the unwanted coupling between the two $G_{max}$ cores as explained in [18], [33].

Figure 8:
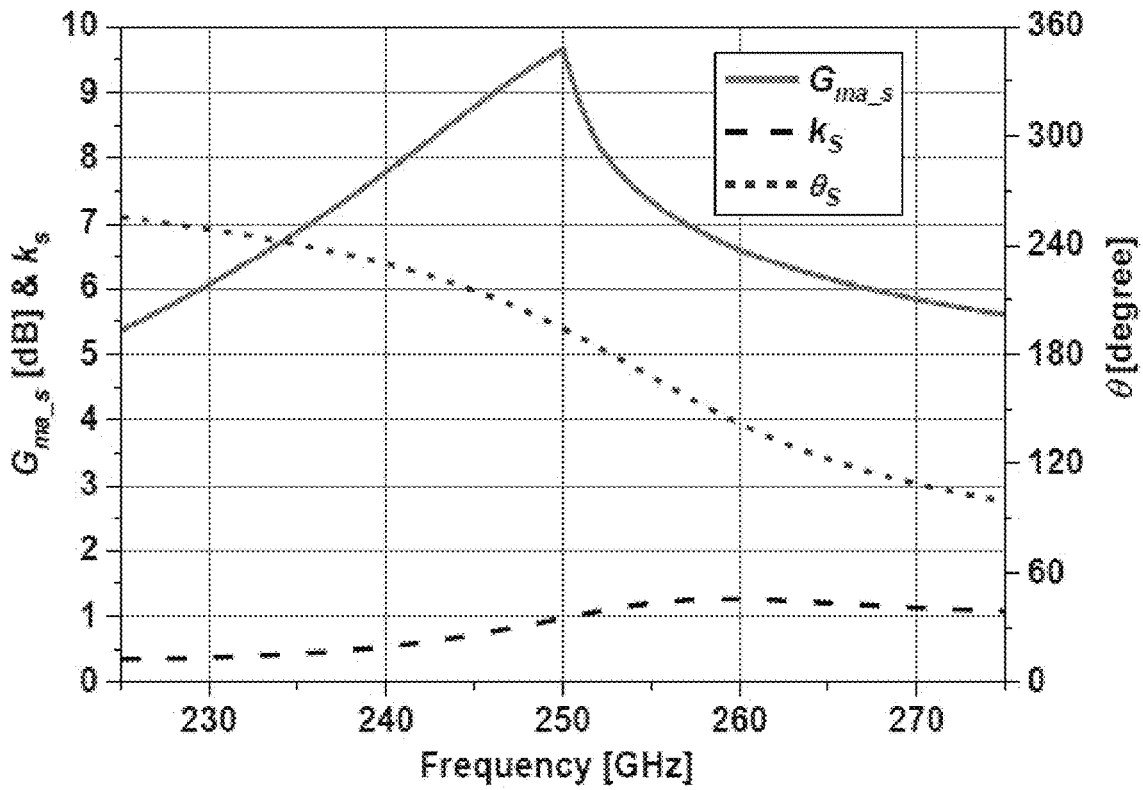
FIG. 8 is simulated Gma_s, ks and $\theta$s of the single-transistor Gmax core as a function of frequency.

FIG. 8 is simulated Gma_s, ks and $\theta$s of the single-transistor Gmax core as a function of frequency.

Referring to FIG. 8, The final values of $TL_1$, $TL_2$, and $TL_3$ for the single-transistor $G_{max}$ core are 24, 18, and 117 um, respectively, which leads to $TL_{ISML}=30$ um. FIG. 8 shows the simulated $G_{ma\_s}$, $k_s$ and $\theta_s$ of the single-transistor $G_{max}$ core as a function of frequency, where their values at 250 GHz are 9.5 dB, 1.02 and 195°, respectively. Due to the loss of embedding network and the offset in $\theta_s$ (1950), $G_{ma\_s}$ is slightly reduced from the theoretical value of $G_{max\_tr}$ (9.95 dB).

Figure 9A:
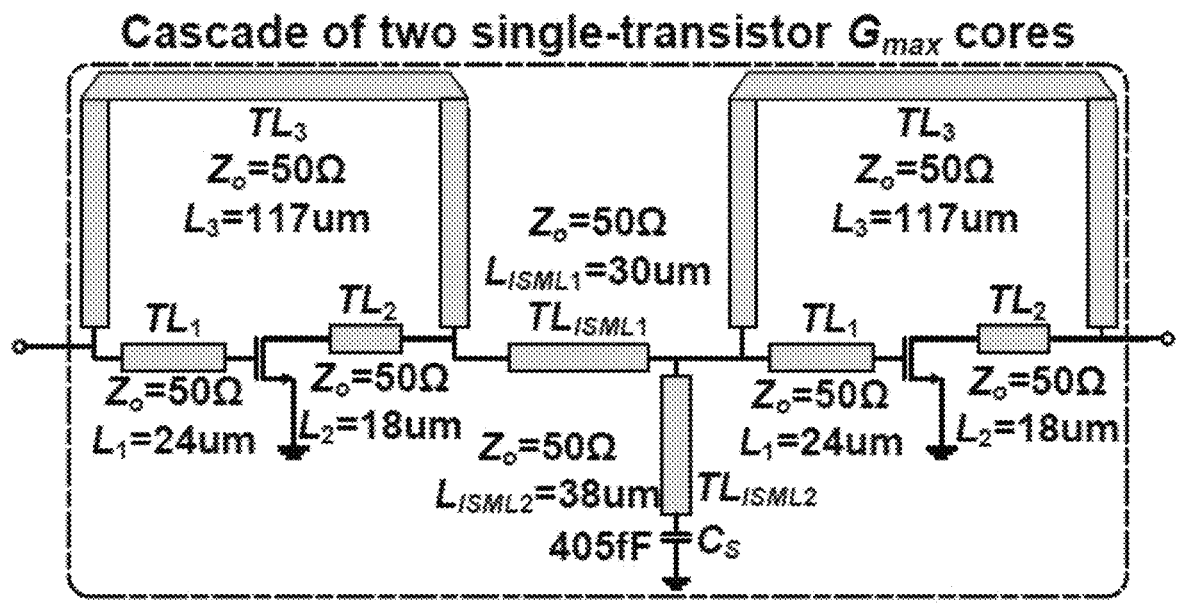
FIG. 9a, FIG. 9b and FIG. 9c is cascade of two single-transistor Gmax cores.
Figure 9B:
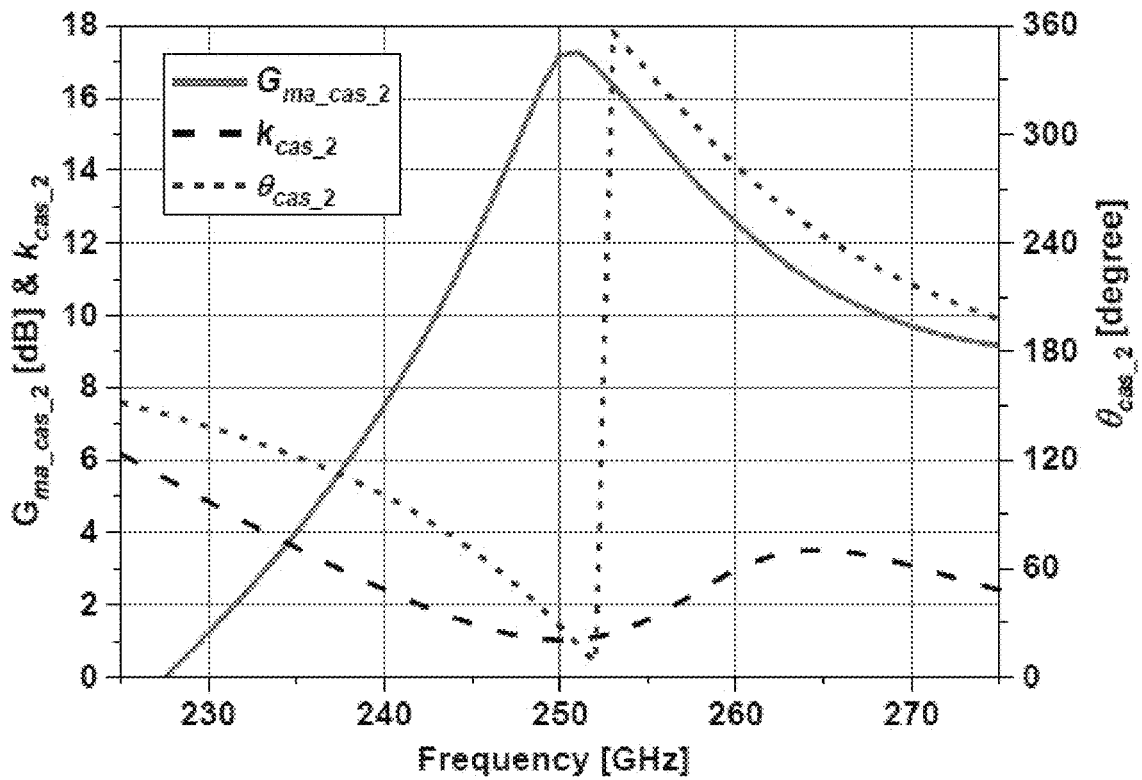
Figure 9C:
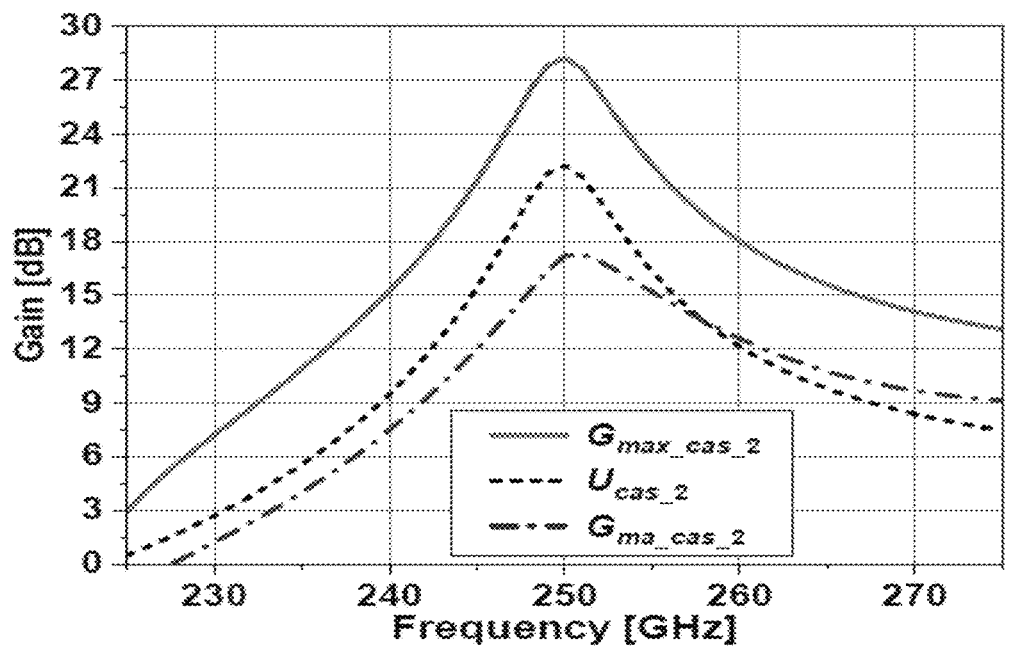

FIG. 9a, FIG. 9b and FIG. 9c is cascade of two single-transistor Gmax cores.

Referring to FIG. 9a, FIG. 9b and FIG. 9c, The cascade of two single-transistor Gmax cores can be implemented with two single-transistor Gmax cores and the interstage matching network. FIG. 9a, FIG. 9b and FIG. 9c shows the schematic of the cascade of two single-transistor Gmax cores and its simulated kcas_2 and θcas_2, as well as the comparison of Gma_cas_2, Ucas_2 and Gmax_cas_2. In FIG. 9a, the two single-transistor Gmax cores are matched by the 30 um TLISML1 in combination with a shunted TLISML2. As shown in FIG. 9b, the values of kcas_2 and θcas_2 are 1.02 and 30° (=195°+195°), respectively. Note that, the interstage matching network does not affect the kcas 2 since it introduces the same amount of phase shifts in both forward and reverse directions, which compensate each other. The insertion losses of the embedding and interstage matching components lead to kcas_2 slightly higher than 1, which leads to Gma_cas_2, Ucas_2 and Gmax_cas_2 of 17.2, 22.2 and 28.3 dB, respectively, as shown in FIG. 9c.

Figure 10A:
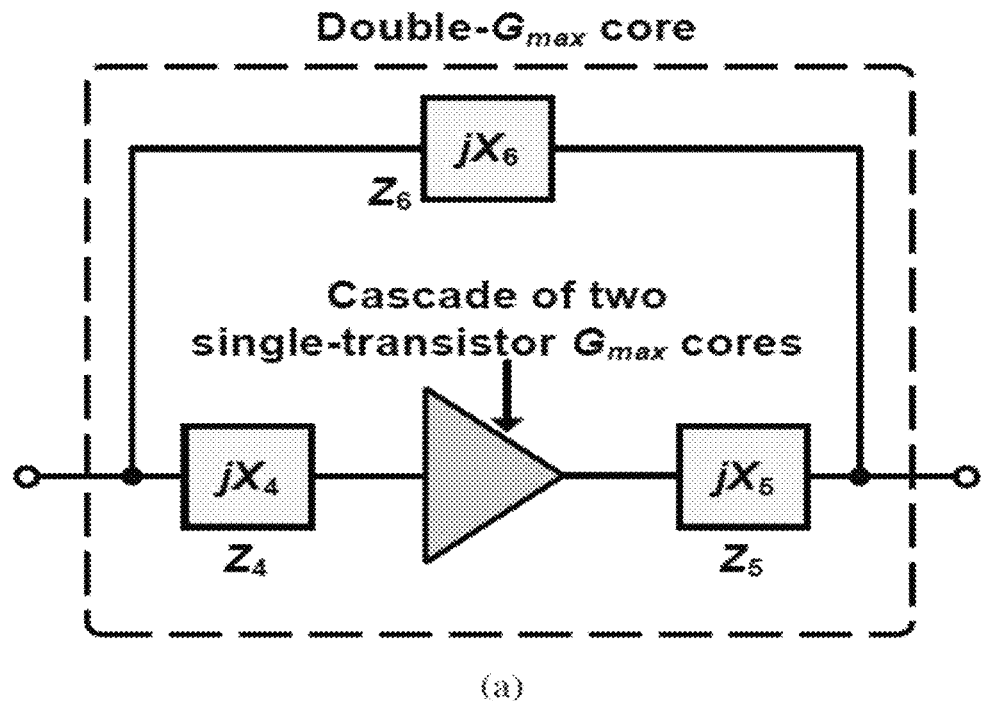
FIG. 10a and FIG. 10b shows the design of double-$G_{max}$ core which is implemented with three passive elements as in single-transistor Gmax core.
Figure 10B:
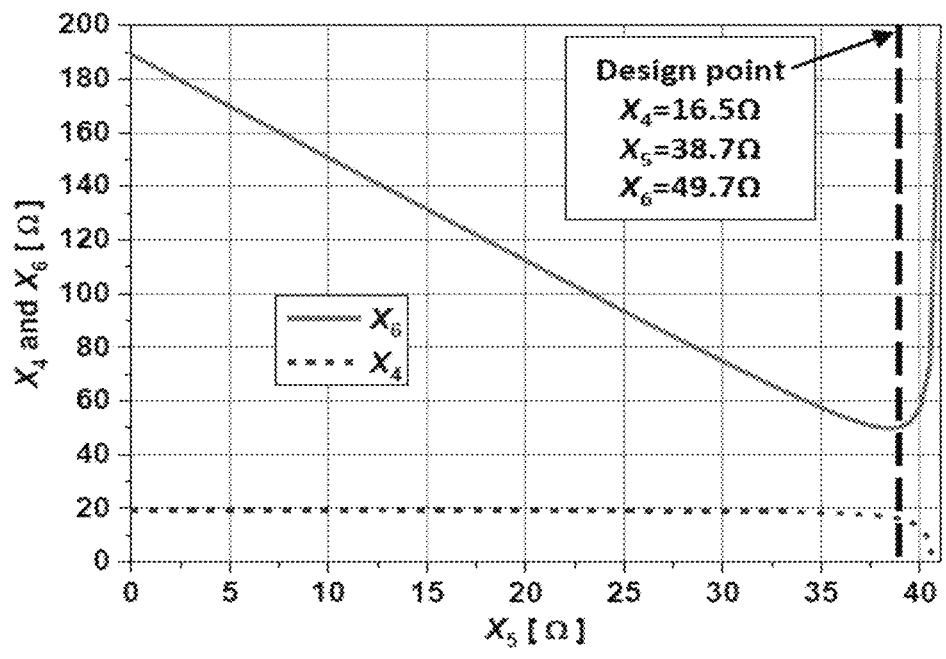

FIG. 10a and FIG. 10b shows the design of double-$G_{max}$ core which is implemented with three passive elements as in single-transistor $G_{max}$ core. FIG. 10a and FIG. 10b shows the required reactance values of $X_6$ and $X_4$ as a function of $X_5$ at 250 GHz, to meet $k_d=1$ and $\theta_d=180°$ of $G_{max}$. As shown in FIG. 10a and FIG. 10b, the lowest required reactance value of $X_6$ is chosen for the design considering the limited implementable value caused by minimum metal width and the resulting insertion loss of the $TL_6$. For the design simplicity, $Z_o$ of 50Ω is adopted for the TLs implementing $Z_4$, $Z_5$ and $Z_6$.

Figure 11:
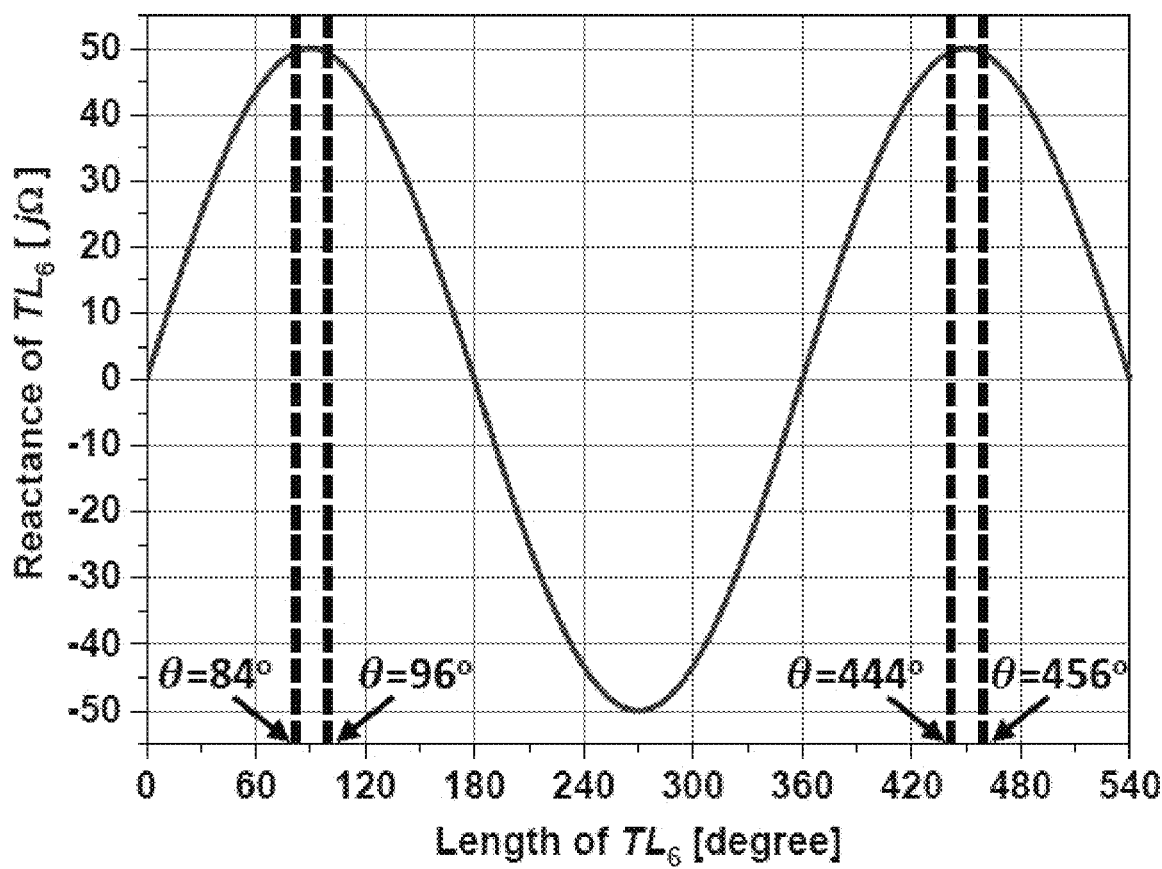
FIG. 11 is reactance of TL6 as a function of physical length in degree.

FIG. 11 is reactance of $TL_6$ as a function of physical length in degree.

Referring to FIG. 11, shows the reactance of $TL_6$ as a function of physical length in degree. As shown in FIG. 11, the reactance value of TL shows the periodic characteristic since the equivalent TL reactance value is $Z_o \sin(\beta l)$, where $\beta$ and l represent propagation constant and physical length of TL, respectively. The TL length of 84°, 96°, 444° and 456° meet the required reactance value of j49.7Ω in a one and half period. A long TL length of 444° is adopted for $TL_6$, even though short line has advantage in terms of loss, to avoid the coupling between the outer and inner passive elements of the $G_{max}$ cores as well as the convenience of the measurement. A proper amount of spacing is required between the input and output pads of an amplifier for the on-wafer probing, therefore, mandates longer TL length than the minimum required size. The final sizes of $TL_4$, $TL_5$, and $TL_6$ are 35, 92, and 805 um, respectively. If the double-$G_{max}$ core is implemented as a component of a bigger circuit, more compact layout would be feasible.

Figure 12A:
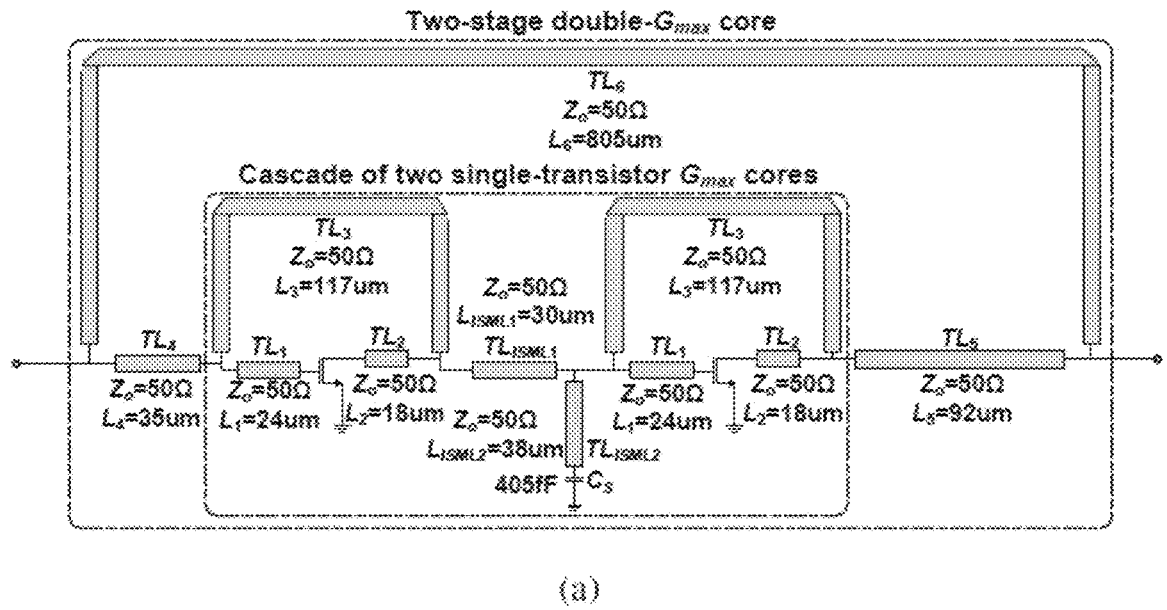
FIG. 12a, FIG. 12b and FIG. 12c is Proposed 250 GHz two-stage double-Gmax core.
Figure 12B:
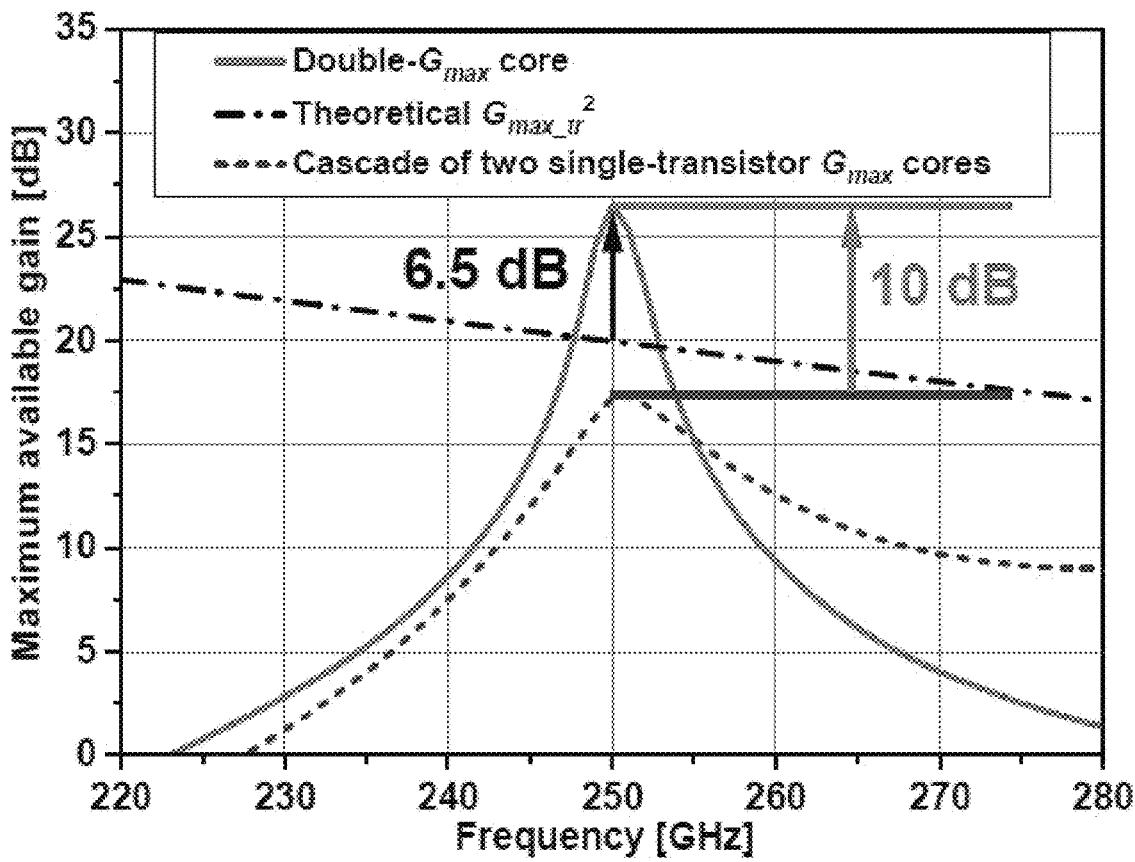
Figure 12C:
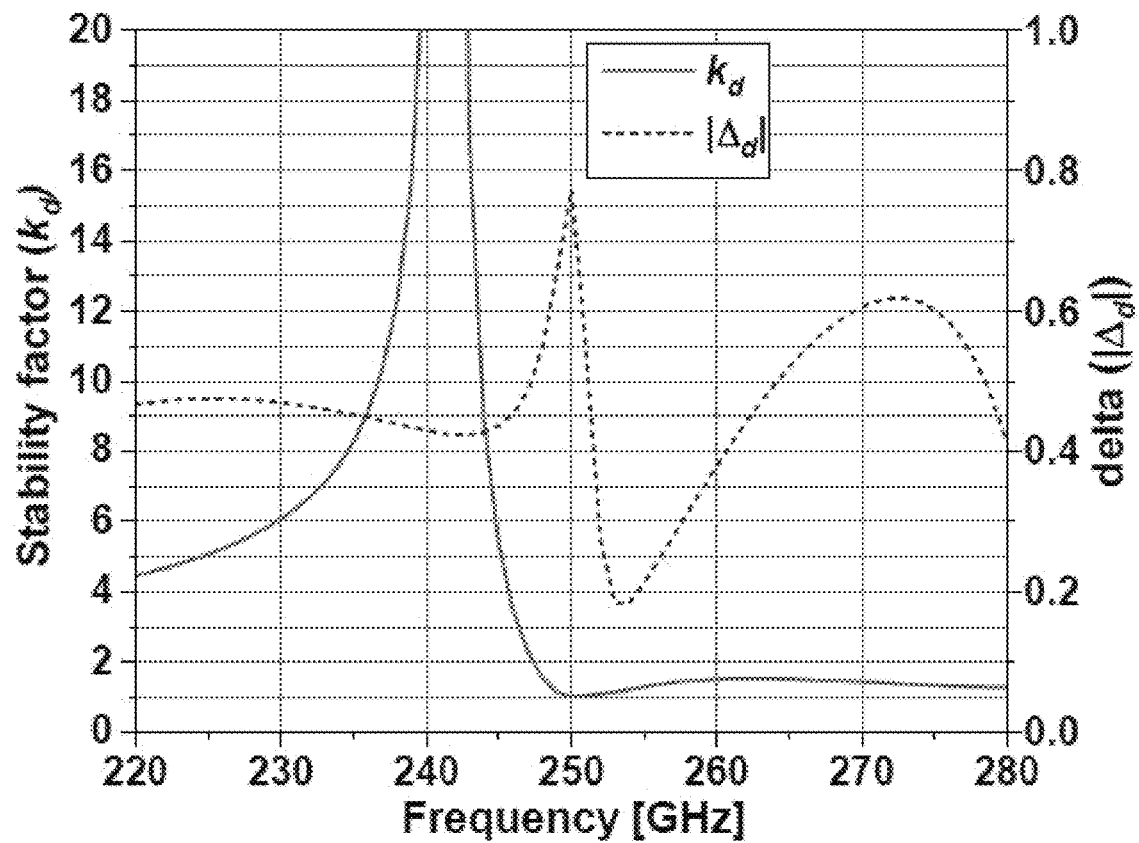

FIG. 12a, FIG. 12b and FIG. 12c is Proposed 250 GHz two-stage double-Gmax core.

Referring to FIG. 12a, FIG. 12b and FIG. 12c, shows the final details of the proposed double-$G_{max}$ core and its simulated maximum available gain in comparison with those of the cascade of two single-transistor $G_{max}$ cores ($G_{ma\_cas\_2}$) and the theoretical $G_{max\_tr}^2$, and k-factor and $|\Delta|=|S_{11}S_{22}-S_{12}S_{21}|$ as a function of frequency. In FIG. 12b, the values of gain for double-$G_{max}$ core ($G_{ma\_d}$), $G_{ma\_cas\_2}$ and $G_{max\_tr}^2$ are 26.5, 16.5 and 20 dB, respectively, at 250 GHz. Note that, $G_{ma\_cas\_2}$ in FIG. 12b is lower than the ideal $G_{max\_tr}^2$ by 3.5 dB due to the losses of the embedding and matching networks. In FIG. 12b, $G_{ma\_d}$ shows a higher gain than $G_{ma\_cas\_2}$ and $G_{max\_tr}^2$ by 10 and 6.5 dB, respectively. As shown in FIG. 12c, the double-$G_{max}$ core shows unconditional stability ($k_d$>1 and $|\Delta|$<1). The embedding network loss increases the $k_d$ slightly higher than 1, which makes simultaneous conjugate input and output matching networks design possible. The simulated value of $k_d$ is 1.02 at 250 GHz. Due to the losses from $TL_4$, $TL_5$, and $TL_6$, and overall $k_d$ of 1.02, the maximum available gain of double-$G_{max}$ core (26.5 dB) is lower than $G_{max\_cas\_2}$ (28.3 dB) in FIG. 9c by 1.8 dB.

Figure 13:
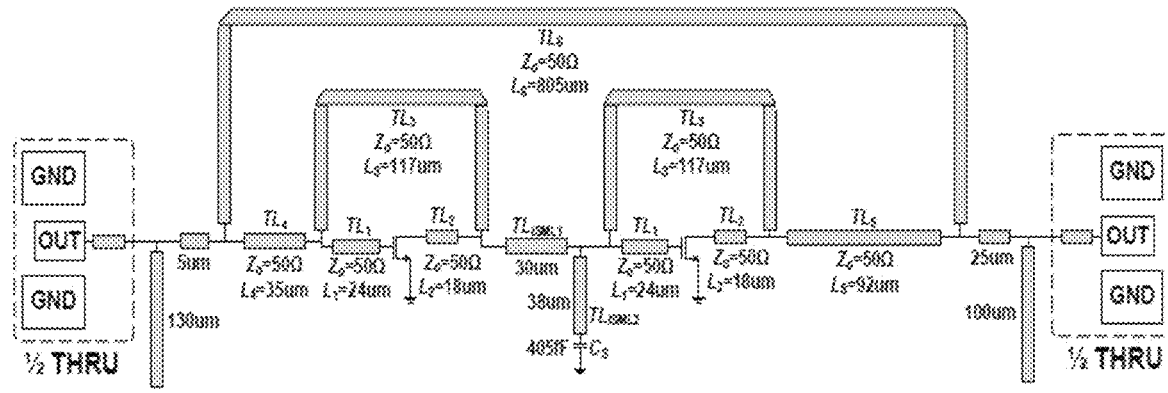
FIG. 13 shows the circuit schematics of the 250 GHz amplifier that adopts the double-Gmax core by adding the input and output matching networks.

FIG. 13 shows the circuit schematics of the 250 GHz amplifier that adopts the double-Gmax core by adding the input and output matching networks.

Referring to FIG. 13, To demonstrate the feasibility of the proposed double-Gmax gain boosting technique, two-stage 250 GHz amplifiers are designed in a 65 nm CMOS process. FIG. 13 the circuit schematics of the 250 GHz amplifier that adopts the double-Gmax core described in Section IV by adding the input and output matching networks. The input and output admittances of the 250 GHz double-Gmax core for simultaneous conjugate matching were 0.022-j0.024 S and 0.028-j0.027 S, respectively. The input and output real part matching can be achieved by relatively short series TLs as shown in FIG. 13 since the input and output conductances are quite close to 0.02 S (=1/50). Then, the input and output susceptances can be canceled by using open stub TLs. The simulated insertion losses of the input and output matching networks of the 250 GHz amplifier were 0.9 and 1.5 dB, respectively.

All or some of the respective exemplary embodiments may be selectively combined with each other so that the above-mentioned exemplary embodiments may be variously modified.

According to the disclosed invention, gain boosting is primarily performed, and then secondarily performed to obtain a greater gain than the existing maximum achievable gain Gmax.

In addition, it is to be noted that the exemplary embodiments are provided in order to describe the present invention rather than limiting the present invention. Further, it may be understood by those skilled in the art to which the present invention pertains that various exemplary embodiments are possible without departing from the spirit and scope of the present invention.

What is claimed is:

1. A high-gain amplifier based on double-gain boosting, comprising:
   a first gain amplification unit including a first amplifier, a second amplifier, and an interstage matching network connected between the first amplifier and the second amplifier and performing primary amplification; and
   a second gain amplification unit connected in parallel with the first gain amplification unit and performing secondary boosting, wherein the first amplifier and the second amplifier include:
   a first transmission line;
   a transistor connected to a rear end of the first transmission line;
   a second transmission line connected to a rear end of the transistor; and
   a third transmission line connected to a front end of the first transmission line and a rear end of the second transmission line and connected in parallel with the first transmission line, the transistor, and the second transmission line.

2. The high-gain amplifier of claim 1, wherein the second gain amplification unit includes:
   a fourth transmission line connected between a front end of the first amplifier and an input terminal;
   a fifth transmission line connected between a rear end of the second amplifier and an output terminal; and
   a sixth transmission line connected between a front end of the fourth transmission line and a rear end of the fifth transmission line.

3. The high-gain amplifier of claim 1, further comprising:
   a second matching unit connected to a rear end of the second amplifier; and
   a third amplifier connected between a rear end of the second matching unit and the second gain amplification unit.

* * * * *